(12) United States Patent
Zhu et al.

(10) Patent No.: US 11,613,466 B2
(45) Date of Patent: Mar. 28, 2023

(54) ULTRA-LONG CHIRAL CARBON NANOTUBE, METHOD FOR PREPARING THE SAME, APPLICATION THEREOF, AND HIGH-PERFORMANCE PHOTOELECTRIC DEVICE

(71) Applicant: Tsinghua University, Beijing (CN)

(72) Inventors: Zhenxing Zhu, Beijing (CN); Fei Wei, Beijing (CN); Jun Gao, Beijing (CN); Silei Sun, Beijing (CN)

(73) Assignee: Tsinghua University, Beijing (CN)

( * ) Notice: Subject to any disclaimer, the term of this patent is extended or adjusted under 35 U.S.C. 154(b) by 88 days.

(21) Appl. No.: 17/131,676

(22) Filed: Dec. 22, 2020

(65) Prior Publication Data

US 2021/0198109 A1 Jul. 1, 2021

(51) Int. Cl.
*C01B 32/158* (2017.01)
*C01B 32/162* (2017.01)

(52) U.S. Cl.
CPC .......... *C01B 32/158* (2017.08); *C01B 32/162* (2017.08); *C01B 2202/04* (2013.01); *C01B 2202/06* (2013.01); *C01B 2202/30* (2013.01); *C01B 2202/34* (2013.01); *C01B 2202/36* (2013.01)

(58) Field of Classification Search
CPC . C01B 32/158; C01B 32/162; C01B 2202/04; C01B 2202/06; C01B 2202/30; C01B 2202/34; C01B 2202/36; C01B 32/164; C01B 2202/20; C01B 32/159; C01B 32/16; C01B 32/166; C01B 32/168; C01B 32/17; C01B 32/172; C01B 32/174; C01B 32/176; C01B 32/178; C01B 2202/00; C01B 2202/02; C01B 2202/08; C01B 2202/10; C01B 2202/22; C01B 2202/24; C01B 2202/26; C01B 2202/28; C01B 2202/32; H01L 51/0048; H01L 2251/55; D01F 9/12; D01F 9/127; D01F 9/1271; D01F 9/1272; D01F 9/1273; D01F 9/1274; D01F 9/1275; D01F 9/1276; D01F 9/1277; D01F 9/1278; D01F 9/133
See application file for complete search history.

(56) References Cited

U.S. PATENT DOCUMENTS

2009/0297847 A1* 12/2009 Kim ................. B01J 23/745
422/198

* cited by examiner

*Primary Examiner* — Daniel C. McCracken
(74) *Attorney, Agent, or Firm* — Arch & Lake LLP

(57) ABSTRACT

This disclosure relates to the technical field of carbon nanotubes, provides an ultra-long chiral carbon nanotube and a method for preparing the same. The ultra-long chiral carbon nanotube has a diameter of about 1.5 nm to 5.5 nm and has a length of about 100 mm to 650 mm, the ultra-long chiral carbon nanotube includes a double-walled carbon nanotube and a triple-walled carbon nanotube, and each layer of the ultra-long chiral carbon nanotube is semiconducting and has a helix angle greater than 10°.

18 Claims, 8 Drawing Sheets

ULTRA-LONG CHIRAL CARBON NANOTUBE, METHOD FOR PREPARING THE SAME, APPLICATION THEREOF, AND HIGH-PERFORMANCE PHOTOELECTRIC DEVICE

CROSS-REFERENCE TO RELATED APPLICATIONS

The present application claims the benefit of Chinese Patent Application No. 201911363396.5, filed on Dec. 25, 2019, the entire content of which is hereby incorporated by reference for all purposes.

TECHNICAL FIELD

This disclosure relates to the technical field of carbon nanotubes, particularly to an ultra-long chiral carbon nanotube and a method for preparing the same, application of the same, and a high-performance optoelectronic device.

BACKGROUND

Carbon is the basic element of life. The simplest chain combination of carbon atoms is carbon nanotubes. Such special carbon material, which has a hollow tubular structure and a high aspect ratio, can be deemed as formed with a two-dimensional graphene rolled in a certain direction, where carbon nanotubes formed with different directions of rotation axis have different optical rotation and chiral parameters. In an environment with specific temperature, pressure, and gas, hundreds of billions of carbon atom pairs can be precisely assembled on a template in the form of spiral dislocations with ultra-high flight times. Accurate control of the chirality of carbon nanotubes is not only beneficial to exerting its inherently excellent optical, electrical, mechanical, and thermal properties, but also greatly promotes the deconstruction and recognition of the carbon skeleton of life information. If the chirality of carbon nanotubes is regarded as traits, the genetic information that determines its exact expression lies in the interface energy of armchair-shaped and sawtooth-shaped atoms at the interface between the catalyst and carbon nanotube, in addition, the degree of match between chirality and catalyst structure determines the dynamic assembly speed of carbon atoms. Generally, when specific chiral-traits are represented using rational design methods, the catalyst is required to have a multiple symmetrical crystal plane structure and suitable carbon atom interface energy, however, lack of correspondence between such information and chirality has brought great difficulties to this top-down regulation. On the other hand, it is difficult for chiral-traits expressed to achieve long-term stability and perfection, which brings great challenges to the macroscopic preparation of carbon nanotubes and their theoretical excellent performance in practical applications. Especially for multi-walled carbon nanotubes with more complex structures, how to maintain the long-term stability of an atomic structure is still an open question.

The present disclosure is proposed in view of the above.

SUMMARY

This application provides an ultra-long chiral carbon nanotube to alleviate the technical problem that it is difficult for existing carbon nanotubes to maintain long-term stability of the atomic structure.

The ultra-long chiral carbon nanotube according to embodiments has a diameter of about 1.5 nm~5.5 nm and a length of about 100 mm~650 mm. The ultra-long chiral carbon nanotube is one of a double-walled carbon nanotube and a triple-walled carbon nanotube, and each layer of the ultra-long chiral carbon nanotube is semiconducting and with a helix angle greater than 10°. The ultra-long chiral carbon nanotube has perfect atomic arrangement and stable structure as well as narrow chiral distribution, accordingly it has excellent optical, electrical, mechanical, and thermal properties, and has broad application prospects in the field of high-performance photoelectric devices.

The method for preparing the ultra-long chiral carbon nanotube according to embodiments is simple in process and is easy to control. The ultra-long chiral carbon nanotube has a stable growth rate, which is conducive to continuous batch production and can achieve large-scale preparation and application of chiral carbon nanotubes.

BRIEF DESCRIPTION OF THE DRAWINGS

To illustrate particular embodiments of the disclosure or technical solutions in the prior art, drawings of the embodiments or the description of the prior art will be briefly introduced below. Obviously, the drawings are merely part of the embodiments of the present disclosure. For those of ordinary skill in the art, other drawings can be obtained based on the drawings without creative efforts.

DETAILED DESCRIPTION

Figure 1:
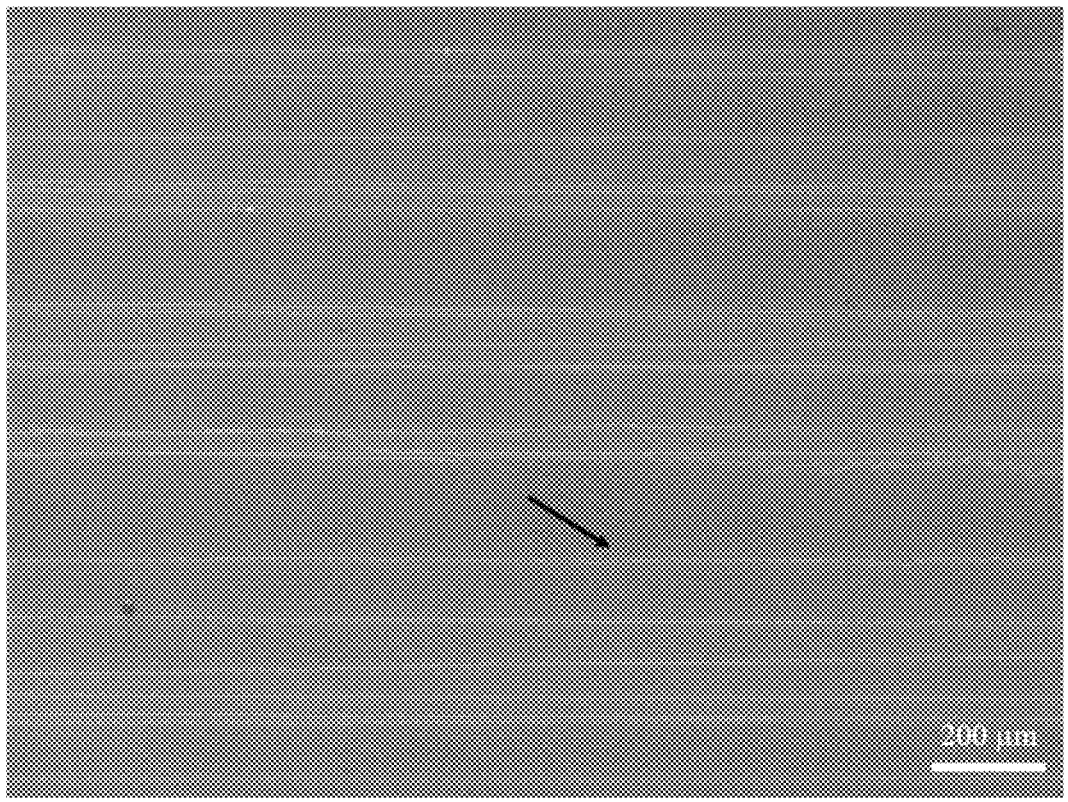
FIG. 1 is a picture of the ultra-long chiral carbon nanotube under a scanning electron microscope (SEM), prepared according to one or more embodiments.

Technical solutions of this disclosure will be clearly and completely described in combination with embodiments below. Obviously, the embodiments provided herein are merely a part of all embodiments of the present disclosure. Based on the embodiments provided herein, all other embodiments obtained by a person of ordinary skill in the art without creative efforts shall fall within the protection scope of the present disclosure.

According to one aspect of the disclosure, an ultra-long chiral carbon nanotube is provided. The ultra-long chiral carbon nanotube has a diameter between about 1.5 nm~5.5 nm and a length between about 100 mm~650 mm. The ultra-long chiral carbon nanotube includes at least one of a double-walled carbon nanotube and a triple-walled carbon nanotube, and each tube layer ("layer" for short) of the ultra-long chiral carbon nanotube is semiconducting and has a chiral angle that is greater than 10°.

For example, the diameter of the ultra-long chiral carbon nanotube is 1.5 nm, 1.8 nm, 2 nm, 2.2 nm, 2.5 nm, 3 nm, 3.5 nm, 4 nm, 4.5 nm, or 5 nm. The length of the ultra-long chiral carbon nanotube is 100 mm, 120 mm, 150 mm, 180 mm, 200 mm, 250 mm, 300 mm, 350 mm, 400 mm, 450 mm, 500 mm, 550 mm, 600 mm, or 650 mm. The values listed above are only examples and the disclosure is not limited thereto.

In at least one embodiment, chirality of the carbon nanotube can be expressed as (n, m), where n and m are chirality indices. For instance, if n−m=3 k, it indicates that the carbon nanotube is metallic; if n−m=3 k+1, it indicates that the carbon nanotube is semiconducting. In both instances provided in this paragraph, k is an integer.

In at least one embodiment, the helix angle of the carbon nanotube, indicated as θ, can be calculated according to the following formula:

$$\theta=\cos^{-1}[(2n+m)/2\sqrt{n^2+m^2+nm}]$$

As mentioned above, the ultra-long chiral carbon nanotube includes at least one of a double-walled carbon nanotube and a triple-walled carbon nanotube. For the double-walled carbon nanotube, each layer thereof has its helix angle that is greater than 10° and is semiconducting. Similarly, for the triple-walled carbon nanotube, each layer thereof has its helix angle that is greater than 10° and is semiconducting.

The expression of "at least one" means that the ultra-long chiral carbon nanotube can be a double-walled carbon nanotube, a triple-walled carbon nanotube, or a combination of the two.

The ultra-long chiral carbon nanotube provided herein includes the double-walled carbon nanotube and the triple-walled carbon nanotube and therefore has a perfect atomic arrangement and a stable structure. In addition, the ultra-long chiral carbon nanotube also has a narrow chirality distribution, which results in excellent optical, electrical, mechanical, and thermal properties. The ultra-long chiral carbon nanotube thus has broad application prospects in the fields of superconducting materials and high-speed devices.

In at least one embodiment, each layer of the ultra-long chiral carbon nanotube has a helix angle ranged from 10° to 30°, that is, 10°<θ≤30°.

When the helix angle of each layer of the ultra-long chiral carbon nanotube is ranged between 10° and 30°, a chirality distribution of the structure of each layer is narrower, and the structure is more uniform.

In at least one embodiment, the ultra-long chiral carbon nanotube has a minimum band gap distribution of 0.2 eV-0.45 eV, which leads to superior optical, electrical, mechanical, and thermal properties of the ultra-long chiral carbon nanotube.

For example, the minimum band gap distribution of the ultra-long chiral carbon nanotube can be 0.2 eV, 0.25 eV, 0.3 eV, 0.35 eV, 0.4 eV, or 0.45 eV.

In at least one embodiment, the double-walled carbon nanotube has its diameter between 1.5 nm~3.2 nm, and a difference between the two helix angles of respective layers is α, wherein 0°<α<15°. The double-walled carbon nanotube has at least one tube wall ("wall" for short) with its chiral angle as β, wherein β>25° or β=19°±3°, as such, the atomic arrangement of the double-walled carbon nanotube is improved and stable, the chiral distribution thereof is narrower, and the optical, electrical, mechanical, and thermal properties thereof are improved.

For example, the diameter of the double-walled carbon nanotube is for example 1.5 nm, 1.6 nm, 1.8 nm, 2 nm, 2.2 nm, 2.5 nm, 2.8 nm, 3 nm, or 3.2 nm. The difference between the two helix angles of respective layers is 1°, 2°, 5°, 8°, 10°, 12°, 13°, 14°, 14.5°, or 14.9°. For example, the β can be 16°, 22°, 25.1°, 25.5°, 26°, 28°, 30°, 35°, 40°, 45°, or 50°.

In at least one embodiment, when 25°<β≤30°, the chiral distribution of the double-walled carbon nanotube is narrower, and its structure is more uniformed.

In at least one embodiment, when the diameter of the double-walled carbon nanotube is 2 nm~3.5 nm and the length of the double-walled carbon nanotube is about 154 nm~650 nm, the double-walled carbon nanotube has more perfect and stable structure, and better optical, electrical, mechanical, and thermal properties thereof can be obtained.

In at least one embodiment, when the double-walled carbon nanotube has a first layer having its helix angle as 19.1° and a second layer having its helix angle that is greater than 25°, the double-walled carbon nanotube can have a better overall performance.

In at least one embodiment, the triple-walled carbon nanotube has its diameter between about 2.5 nm~5.5 nm. The triple-walled carbon nanotube has at least one wall which has its helix angle asγ, wherein γ>25° or γ=19°±3°. Each layer of the triple-walled carbon nanotube has its respective helix angle that is different from others. As such, the triple-walled carbon nanotube has perfect and stable atomic arrangement as well as narrow chiral distribution and accordingly, has excellent optical, electrical, mechanical, and thermal properties.

For example, the diameter of the triple-walled carbon nanotube is 2.5 nm, 2.6 nm, 2.8 nm, 3 nm, 3.2 nm, 3.5 nm, 3.8 nm, 4 nm, 4.2 nm, 4.5 nm, 4.8 nm, 5 nm, 5.2 nm, or 5.5 nm; and, the γ can be set to 16°, 22°, 25.1°, 25.5°, 26°, 28°, 30°, 35°, 40°, 45°, or 50°.

In at least one embodiment, when 25°<γ≤30°, the triple-walled carbon nanotube has a narrower chiral distribution and a more uniformed structure.

In at least one embodiment, when the length of the triple-walled carbon nanotube is about 154 nm~650 nm, the triple-walled carbon nanotube has more perfect and stable structure, and the optical, electrical, mechanical and thermal properties thereof are better.

In at least one embodiment, when the triple-walled carbon nanotube has a first layer having its helix angle of 19.1° and a second layer having its helix angle greater than 25°, the triple-walled carbon nanotube has a better overall performance.

According to yet another aspect of the disclosure, inspired by the evolution of proteins, of which random variations of genetic information can be achieved by using a catalyst interface without stable morphology and changing assembly environment of carbon atoms. Accordingly, particular chiral multi-walled carbon nanotubes with stable structure and high growth rate can be automatically selected and identified based on the assembled structures of carbon dimers.

A method for preparing the ultra-long chiral carbon nanotube in accordance with the disclosure, includes the following:

(a) loading a catalyst in the form of solid, liquid or gas, as well as a substrate, into a reactor.

(b) raising a temperature in the reactor to a reaction temperature under protection of inert reducing gas, then introducing a gas mixture consisting of a carbon source and a carrier gas into the reactor for reaction.

(c) introducing the inert reducing gas into the reactor after the reaction completed, cooling the reactor, and obtaining the ultra-long chiral carbon nanotube.

The method for preparing the ultra-long chiral carbon nanotube provided herein is simple in process and easy to control, in addition, the ultra-long chiral carbon nanotube is stable in growth rate, which is beneficial to continuous batch production and realizes large-scale preparation and application of the chiral carbon nanotube.

In at least one embodiment, the catalyst includes a transition metal element and/or a transition metal compound.

The term "and/or" used herein refers to that the catalyst can include the transition metal element, or the transition metal compound, or a mixture of said two.

The transition metal compound includes but not limited to transition metal oxides, transition metal hydroxides, and transition metal salts.

In one embodiment, a transition metal herein includes at least one of Fe, Co, Ni, Cu, Zn, Cr, Ti, Pd, Pt, and Au.

The term "at least one" used hereabove refers to the transition metal that can be Fe, Co, Ni, Cu, Zn, Cr, Ti, Pd, Pt, or Au, or an alloy or composite of two or more of the metals listed above.

In one embodiment, a manner in which the catalyst is loaded into the reactor includes at least one of spin coating, embossing, evaporation, and vapor deposition.

The term "at least one" used hereabove refers to that the catalyst is loaded into the reactor by spin coating, imprinting, evaporation, vapor deposition, or by two or more of the above manners.

In one embodiment, the catalyst can be loaded into the reactor in any one of the following manners or can be loaded into the reactor in a combination of two or more than two of the following manners: spin coating on a front surface of the substrate, imprinting on the front surface of the substrate, depositing a catalyst film on the front surface of the substrate, and vapor depositing the catalyst on walls of the reactor.

In one embodiment, in step (b), the reaction temperature is about 900° C.~1200° C. and reaction time is about 6 min~50 min.

When the temperature in the reactor is raised to about 900° C.~1200° C., in the presence of the catalyst, the carbon source begins to grow a carbon nanotube on the substrate, when the reaction time is about 6 min~50 min, the carbon nanotube grows into an ultra-long chiral carbon nanotube.

For example, in step (b), the reaction temperature is 900° C., 950° C., 1000° C., 1050° C., 1100° C., 1150° C., or 1200° C., and the reaction time is 6 min, 7 min, 8 min, 10 min, 12 min, 15 min, 20 min, 22 min, 25 min, 28 min, 30 min, 35 min, 38 min, 40 min, 45 min, or 50 min.

In one embodiment, when the reaction time is about 6 min~15 min, a first ultra-long chiral carbon nanotube with a length of L1 can be obtained, wherein 50 mm<L1≤100 mm. The first ultra-long chiral carbon nanotube obtained has a purity between 50~60%.

For example, the length of the first ultra-long chiral carbon nanotube is 51 mm, 55 mm, 60 mm, 70 mm, 80 mm, 90 mm, or 100 mm. The purity of the first ultra-long chiral carbon nanotube is 50%, 51%, 52%, 53%, 55%, 58%, or 60%.

In at least one embodiment, when the reaction time is 20 min~3 min, a second ultra-long chiral carbon nanotube with a length of L2 can be obtained, wherein 100 mm<L2≤150 mm. The second ultra-long chiral carbon nanotube obtained has a purity between 80~90%.

For example, the length of the second ultra-long chiral carbon nanotube is 101 mm, 105 mm, 110 mm, 115 mm, 120 mm, 125 mm, 130 mm, 135 mm, 140 mm, 145 mm, or 150 mm; the purity of the second ultra-long chiral carbon nanotube is 80%, 81%, 82%, 83%, 85%, 88%, or 100%.

In one embodiment, when the reaction time is about 35 min~50 min, a third ultra-long chiral carbon nanotube with a length of L3 can be obtained, where L3 is greater than about 150 mm and equal or less than about 650 mm. The third ultra-long chiral carbon nanotube obtained has a purity that is 100%.

For example, the length of the third ultra-long chiral carbon nanotube is 151 mm, 200 mm, 250 mm, 300 mm, 350 mm, 400 mm, 450 mm, 500 mm, 550 mm, 600 mm, or 650 mm.

The first ultra-long chiral carbon nanotube, the second ultra-long chiral carbon nanotube, and the third ultra-long chiral carbon nanotube all have characteristics of the ultra-long multi-walled carbon nanotube proposed in a first aspect of the disclosure while differing in their respective lengths and purities.

Therefore, precise control of the length and purity of the ultra-long chiral carbon nanotube can be achieved by different reaction times. Coupling preparation to separation of carbon nanotubes not only avoids pollution and structural damage to carbon nanotubes caused by conventional separation processes, but also facilitates a continuous production of materials, therefore achieving a large-scale preparation and application of the chiral carbon nanotubes with different purities.

In one embodiment, in step (b), when the carbon source is reacting in the reactor, the ultra-long chiral carbon nanotube grows on the substrate with a growth rate between about 70 μm/s and 150 μm/s.

For example, the growth rate of the ultra-long chiral carbon nanotube may be 70 μm/s, 80 μm/s, 90 μm/s, 100 μm/s, 110 μm/s, 120 μm/s, 130 μm/s, 140 μm/s, or 150 μm/s.

According to the embodiments of this disclosure, the ultra-long chiral carbon nanotube has a stable growth rate. The growth rate increases first and then decreases when comparing with the minimum band gap distribution of the ultra-long chiral carbon nanotube.

In one embodiment, in step (b), when the carbon source is reacting in the reactor, an external field can be in-situ introduced at any time of the reaction to assist the growth of the ultra-long chiral carbon nanotube, so as to further improve a selectivity of structures of products.

In one embodiment, the external field includes at least one of the following: an electric field, a magnetic field, a sound field, and a light wave.

The term "at least one" used hereabove refers to that the external field can be the electric field, the magnetic field, the sound field, or the light wave, or a combination of two or more of the same.

In one embodiment, in step (b), before the temperature in the reactor is raised to the reaction temperature, the temperature is raised at a rate between about 10~60° C./min. As such, when the temperature in the reactor is raised to the reaction temperature, an internal environment of the reactor is more conducive to the growth of the ultra-long chiral carbon nanotube.

For example, before the temperature in the reactor is raised to the reaction temperature, the temperature is raised at a rate of 10° C./min, 20° C./min, 30° C./min, 40° C./min, 50° C./min, or 60° C./min.

In one embodiment, the inert reducing gas is a mixture of inert gas and hydrogen, so as to avoid introducing impurity gases into the reactor, which will affect the growth of the ultra-long chiral carbon nanotube.

In one embodiment, a volume ratio of the inert gas to hydrogen in the inert reducing gas is 1.5:1~4:1.

For example, the volume ratio of the inert gas to hydrogen in the inert reducing gas is 1.5:1, 2:1, 2.5:1, 3:1, 3.5:1, or 4:1.

In one embodiment, the carrier gas is hydrogen, which facilitates introduction of the carbon source into the reactor for the reaction, and to avoid the impurity gases being introduced therein.

In one embodiment, a volume ratio of hydrogen in the carrier gas to the carbon source is about 1~5:1.

For example, the volume ratio of hydrogen in the carrier gas to the carbon source is 1:1, 2:1, 3:1, 4:1, or 5:1.

In one embodiment, the carbon source includes at least one of methane, ethane, propane, methanol, ethanol, ethylene, propylene, and carbon monoxide.

The term "at least one" used hereabove refers to that the carbon source can be methane, ethane, propane, methanol, ethanol, ethylene, propylene, or carbon monoxide, or a mixture of two or more of the same.

In at least one embodiment, the carrier gas has a water content between about 0.3-0.6 wt %. Water vapor can play a role in eliminating carbon and balancing pressure in the reaction, by controlling the water content of the carrier gas to be lower than 0.6 wt %, it is possible to avoid high water content that affects growth of the ultra-long chiral carbon nanotube. When the water content of the carrier gas is lower than 0.3 wt %, carbon may be eliminated and pressure may be off balance thereof are counter-productive in reducing production costs of the ultra-long chiral carbon nanotube.

In one embodiment, the inert gas includes at least one of helium, neon, and argon.

The term "at least one" used hereabove refers to that the inert gas can be helium, neon, or argon, or a mixture of any two or three thereof.

In one embodiment, the substrate is made of silicon, quartz, sapphire, alumina, or magnesia.

In one embodiment, in step (c), the temperature in the reactor is cooled to a room temperature to obtain the ultra-long chiral carbon nanotube.

According to a third aspect of the disclosure, application of the ultra-long chiral carbon nanotube in a high-performance optoelectronic device is provided.

The ultra-long chiral carbon nanotube provided according to embodiments has a perfect structure as well as narrow chirality and diameter distributions, and there is a unique chirality correlation between its walls. The ultra-long chiral carbon nanotube has significant advantages when applied to the high-performance optoelectronic device.

In at least one embodiment, the high-performance optoelectronic device includes, but is not limited to, high-speed flash memories, transparent conductive films, radio frequencies, transistors, and alike.

According to a fourth aspect of the disclosure, a high-performance optoelectronic device is provided. The high-performance optoelectronic device includes the ultra-long chiral carbon nanotube provided herein.

In one embodiment, the high-performance optoelectronic device includes, but is not limited to, the high-speed flash memories, the transparent conductive films, the radio frequencies, the transistors, and alike. Technical solutions provided herein are further described below in combination with examples and comparative examples.

Unless otherwise specified, the experimental methods used in the following examples are conventional methods.

Unless otherwise specified, the materials, reagents, etc. used in the following examples are commercially available.

Example 1

The ultra-long chiral carbon nanotube is provided. The ultra-long chiral carbon nanotube can be prepared as follows.

(1) A silicon substrate is placed in a quartz boat, where the silicon substrate is pressed with ethanol solution with 0.1M FeCl3 catalyst. The quartz boat is then placed in a furnace reactor.

(2) 200 sccm (standard liter flow rate per minute) mixture gas of argon and hydrogen (Ar:H2=1:2, v/v) is introduced into the reactor as a protective gas. Start to raise the temperature in the reactor. When the temperature is raised to 900° C.~1010° C., keep the temperature constant for 20 min. Then proceed to a reaction stage and 180 sccm mixture gas of methane and hydrogen (H2:CH4=2:1, v/v) is introduced into the reactor to start preparation reaction of the ultra-long chiral carbon nanotube. The preparation reaction lasts for 25 min.

(3) When the reaction is completed, enter a cooling stage, in which 200 sccm mixture gas of argon and hydrogen (Ar:H2=1:2, v/v) is introduced into the reactor to prevent a carbon tube from being ablated during cooling. When the temperature in the reactor drops to the room temperature, take the sample out of the reactor. As such, the ultra-long chiral carbon nanotube is obtained.

Example 2

The ultra-long chiral carbon nanotube is provided. The ultra-long chiral carbon nanotube can be prepared as follows.

(1) 0.3 g FeCl3 catalyst powder is placed upstream of a gas flow of a round tube-shaped quartz reactor. 200 sccm (standard liter flow rate per minute) mixture gas of argon and hydrogen (Ar:H2=1:2, v/v) is introduced into the reactor as a protective gas. Start to raise the temperature in the reactor. When the temperature is raised to 1010° C., keep the temperature constant for 20 min and then enter a cooling stage. Open the reactor when the temperature thereof drops to the room temperature.

(2) A flat silicon substrate with an oxide layer is placed in the reactor. 200 sccm (standard liter flow rate per minute) mixture gas of argon and hydrogen (Ar:H2=1:2, v/v) is introduced into the reactor as a protective gas. Start to raise the temperature in the reactor. When the temperature is raised to 900° C.~1010° C., keep the temperature constant for 20 min.

(3) Proceed to a reaction stage, 180 sccm mixture gas of methane and hydrogen (H2:CH4=2:1, v/v) is introduced into the reactor to start preparation reaction of the ultra-long chiral carbon nanotube. The preparation reaction lasts for 40 min.

(4) When the reaction is completed, enter a cooling stage, in which 200 sccm mixture gas of argon and hydrogen (Ar:H2=1:2, v/v) is introduced into the reactor to prevent a carbon tube from being ablated during cooling. When the temperature in the reactor drops to the room temperature, take the sample out of the reactor. As such, the ultra-long chiral carbon nanotube is obtained.

Example 3

The ultra-long chiral carbon nanotube is provided. The method for preparing the ultra-long chiral carbon nanotube is the same as Example 1 except that, in step (1), Co element is vapor-deposited on the silicon substrate to form a catalyst film. The description will not be repeated to avoid redundancy.

Example 4

The ultra-long chiral carbon nanotube is provided. The method for preparing the ultra-long chiral carbon nanotube is the same as Example 1 except that, in step (2), the reaction time is 4 min.

Example 5

The ultra-long chiral carbon nanotube is provided. The method for preparing the ultra-long chiral carbon nanotube is the same as Example 1 except that, in step (2), the reaction time is 6 min.

Example 6

The ultra-long chiral carbon nanotube is provided. The method for preparing the ultra-long chiral carbon nanotube is the same as Example 1 except that, in step (2), the reaction time is 10 min.

Example 7

The ultra-long chiral carbon nanotube is provided. The method for preparing the ultra-long chiral carbon nanotube is the same as Example 1 except that, in step (2), the reaction time is 15 min.

Example 8

The ultra-long chiral carbon nanotube is provided. The method for preparing the ultra-long chiral carbon nanotube is the same as Example 1 except that, in step (2), the reaction time is 18 min.

Example 9

The ultra-long chiral carbon nanotube is provided. The method for preparing the ultra-long chiral carbon nanotube is the same as Example 1 except that, in step (2), the reaction time is 20 min.

Example 10

The ultra-long chiral carbon nanotube is provided. The method for preparing the ultra-long chiral carbon nanotube is the same as Example 1 except that, in step (2), the reaction time is 30 min.

Example 11

The ultra-long chiral carbon nanotube is provided. The method for preparing the ultra-long chiral carbon nanotube is the same as Example 1 except that, in step (2), the reaction time is 35 min.

Example 12

The ultra-long chiral carbon nanotube is provided. The method for preparing the ultra-long chiral carbon nanotube is the same as Example 1 except that, in step (2), the reaction time is 40 min.

Example 13

The ultra-long chiral carbon nanotube is provided. The method for preparing the ultra-long chiral carbon nanotube is the same as Example 1 except that, in step (2), the reaction time is 50 min.

Example 14

The ultra-long chiral carbon nanotube is provided. The method for preparing the ultra-long chiral carbon nanotube is the same as Example 1 except that, in step (2), a mixture gas of argon and hydrogen (Ar:H2=1:4, v/v) is introduced into the reactor.

Example 15

The ultra-long chiral carbon nanotube is provided. The method for preparing the ultra-long chiral carbon nanotube is the same as Example 1 except that, in step (2), in the reaction stage, 180 sccm mixture gas of carbon monoxide and hydrogen (H2:CO=2:1, v/v) is introduced into the reactor to start the preparation reaction of the ultra-long carbon nanotube.

Example 16

The ultra-long chiral carbon nanotube is provided. The method for preparing the ultra-long chiral carbon nanotube is the same as Example 1 except that, in step (2), in the reaction stage, 180 sccm mixture gas of methane and hydrogen (H2:CH4=5:1, v/v) is introduced into the reactor to start the preparation reaction of the ultra-long carbon nanotube.

Comparative Example 1

A method for preparing the ultra-long chiral carbon nanotube is provided. The method differs from Example 1 in that no catalyst is put into the reactor. The results show that in comparative example 1, the ultra-long chiral carbon nanotube was not successfully prepared.

Experimental Example 1

Performances of the ultra-long chiral carbon nanotubes obtained in Examples 1~16 are characterized. The results show that in each of Examples 1~16, the ultra-long chiral carbon nanotube prepared has a diameter of about 1.5 nm~5.5 nm and a length of about 100 nm~650 nm.

FIG. 1 is a scanning electron microscope (SEM) picture of the ultra-long chiral carbon nanotubes obtained in Example 1. As shown in FIG. 1, the ultra-long chiral carbon nanotubes are arranged in parallel with each other, and the spacing between two adjacent carbon nanotubes is about 100 μm~200 μm.

Figure 2:
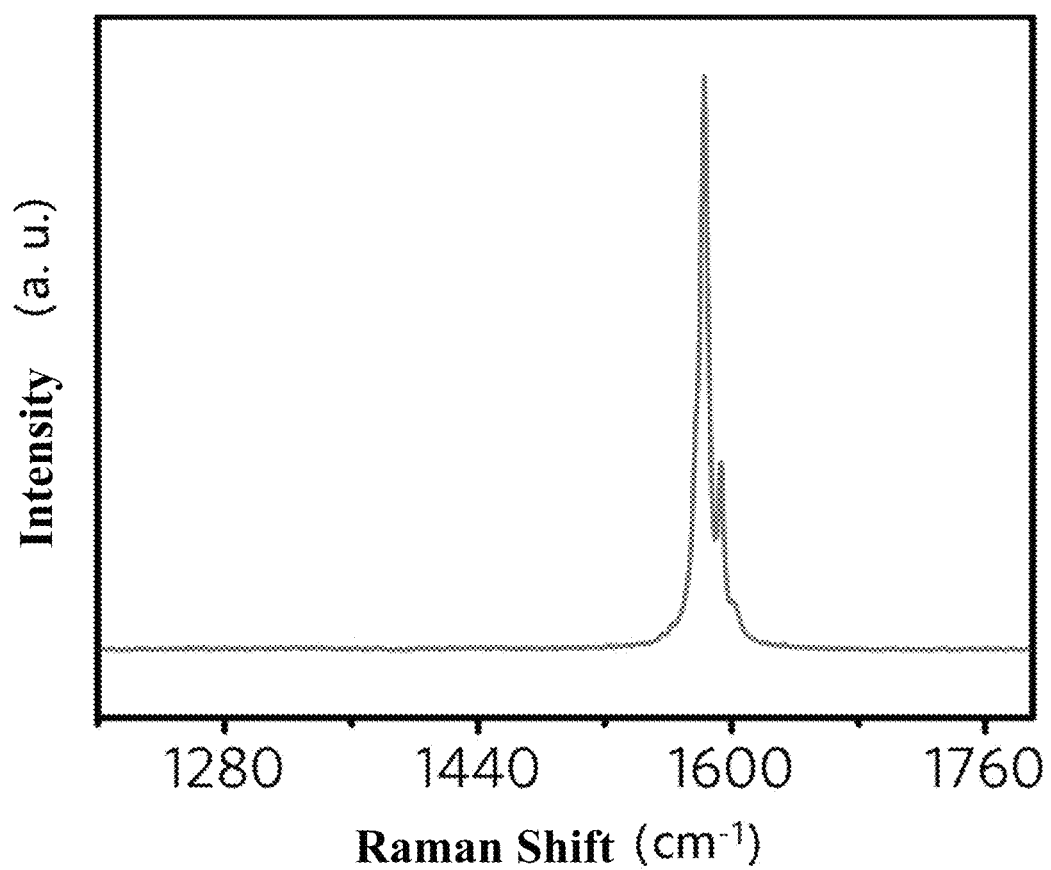
FIG. 2 is a Raman spectrogram of a single piece of the ultra-long chiral carbon nanotube prepared according to one or more embodiments.

FIG. 2 is a Raman spectrogram of a single piece of the ultra-long chiral carbon nanotube (as indicated by the arrow of FIG. 1) obtained in Example 1. As shown in FIG. 2, in the RBM region (100-300 cm-1), the ultra-long chiral carbon nanotube has two peaks which correspond to Raman spectra response of different walls respectively, which indicates that the ultra-long chiral carbon nanotube is a double-walled carbon nanotube. Further, as can be seen from FIG. 2, the ultra-long chiral carbon nanotube shows a symmetrical Lorentz peak at the frequency of 1580 cm-1, which indicates that the carbon nanotube is semiconducting. On the other hand, the ultra-long chiral carbon nanotube has no obvious peak strength at the frequency of 1350 cm-1, which indicates that the ultra-long chiral carbon nanotube has a perfect structure.

Figure 3:
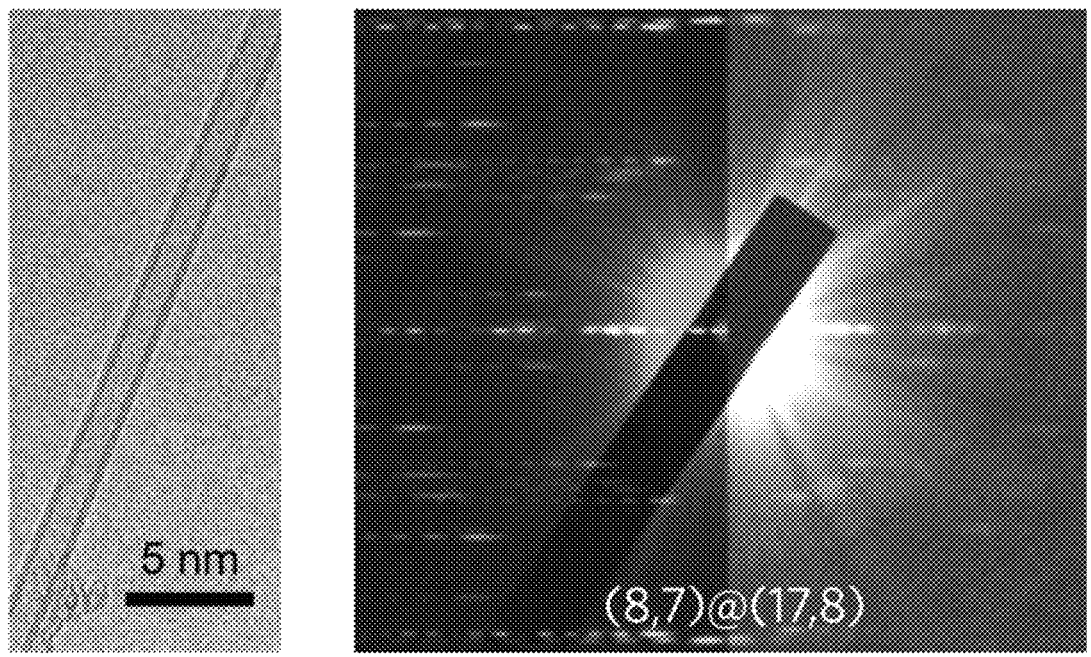
FIG. 3 is a transmission electron micrograph (TEM) and an electron diffraction pattern prepared when the single piece of the ultra-long chiral carbon nanotube, that is prepared according to one or more embodiments, is transferred to micro grids.

FIG. 3 is a transmission electron micrograph (TEM) and an electron diffraction pattern obtained when the single piece of the ultra-long chiral carbon nanotube (as indicated by the arrow of FIG. 1) is transferred to micro grids. As can be seen from the transmission electron micrograph, the ultra-long chiral carbon nanotube has a diameter of 1.73 nm. As shown from a spot analysis of electron diffraction in FIG. 3, the chirality of the ultra-long chiral carbon nanotube is (8, 7) @ (17, 8).

According to the above characterization method, the chirality of all ultra-long chiral carbon nanotubes prepared in Example 1 is counted, and the results show that among 50 carbon nanotubes with a length of more than 100 mm, 86% are chiral carbon nanotubes with similar characteristics.

Figure 4:
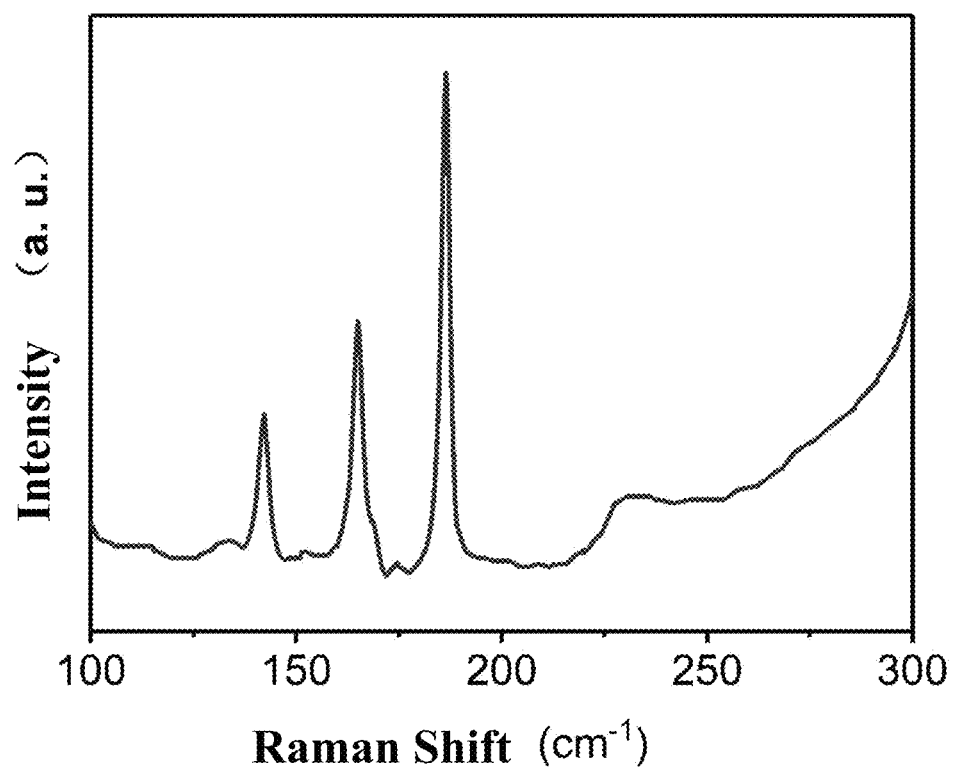
FIG. 4 is a Raman spectrogram of the single piece of the ultra-long chiral carbon nanotube prepared according to one or more embodiments.

FIG. 4 is a Raman spectrogram of the single piece of the ultra-long chiral carbon nanotube prepared in Example 2. As shown in the RBM region (100-300 cm-1) of FIG. 4, the ultra-long chiral carbon nanotube has three peaks which correspond to Raman spectra response of different walls respectively, which indicates that the ultra-long chiral carbon nanotube is a triple-walled carbon nanotube.

Figure 5:
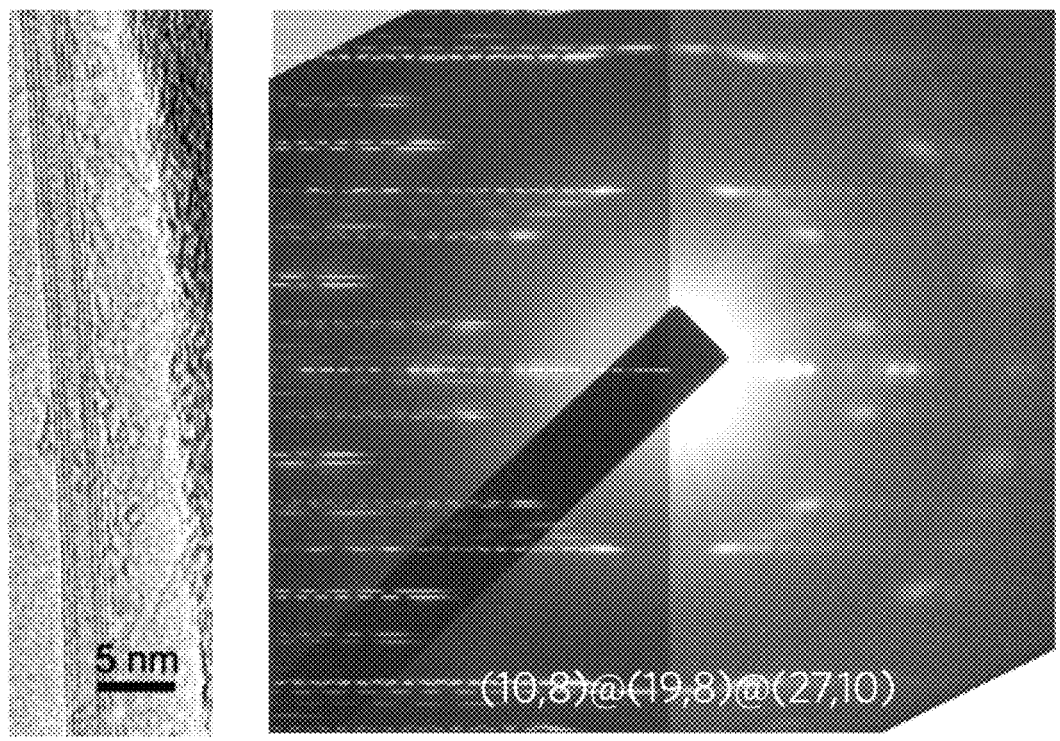
FIG. 5 is a transmission electron micrograph (TEM) and an electron diffraction pattern prepared when the single piece of the ultra-long chiral carbon nanotube, that is prepared according to one or more embodiments, is transferred to micro grids.

FIG. 5 is a transmission electron micrograph (TEM) and an electron diffraction pattern obtained when the single piece of the ultra-long chiral carbon nanotube prepared in Example 2 is transferred to micro grids. As shown in FIG. 5, the ultra-long chiral carbon nanotube is a triple-walled carbon nanotube. As shown in the TEM of FIG. 5, the triple-walled carbon nanotube has the diameter of 2.60 nm, and at the same time, as shown from the electron diffraction pattern, the chirality of the ultra-long chiral carbon nanotube is (10, 8) @ (19, 8) @ (27, 10).

According to the above characterization method, the chirality of all ultra-long chiral carbon nanotubes prepared in Example 2 is counted, the results show that among 43 carbon nanotubes with a length of more than 150 mm, 100% are the chiral carbon nanotubes with similar characteristics.

Experimental Example 2

A structural consistency of the single piece of the ultra-long chiral carbon nanotube prepared in Examples 1-16 is measured with white laser Rayleigh scattering. The results show that the single piece of the ultra-long chiral carbon nanotube prepared in Examples 1-16 all show same color, which indicates that the single piece of the ultra-long chiral carbon nanotube prepared in Examples 1-16 has completely consistent atomic spiral arrangements in the length direction.

Figure 6:
FIG. 6 is a resonant Rayleigh scattering pattern of the single piece of the ultra-long chiral carbon nanotube prepared according to one or more embodiments.

FIG. 6 is a white laser-Rayleigh scattering pattern of the single piece of the ultra-long chiral carbon nanotube prepared in Example 2. As shown in FIG. 6, said single piece of the ultra-long chiral carbon nanotube has same color at different positions, which indicates that this single piece of the ultra-long chiral carbon nanotube has a completely identical atomic structure in the length direction.

Experimental Example 3

The radial breathing mode of a multi-walled carbon nanotubes prepared in Examples 1-16 in the range of 100-300 cm-1 is determined with Raman spectra, thus directly reflects its chiral structure fingerprint information of the carbon nanotubes. The number of peaks ("peak number" for short) varies with the number of carbon nanotubes. In addition, different chiralities of the carbon nanotubes result in different peak positions. As such, according to the number and position of peaks in the region of radial breathing mode, the structural consistency of carbon nanotubes can be determined. The results of Raman spectra show that, for the ultra-long chiral carbon nanotubes prepared in Examples 1-16, the Raman spectra collected in different length areas have the same peak position and peak number, which indicates that the ultra-long chiral carbon nanotubes prepared in Examples 1-16 have stable atomic structure and stable wall number.

Figure 7:
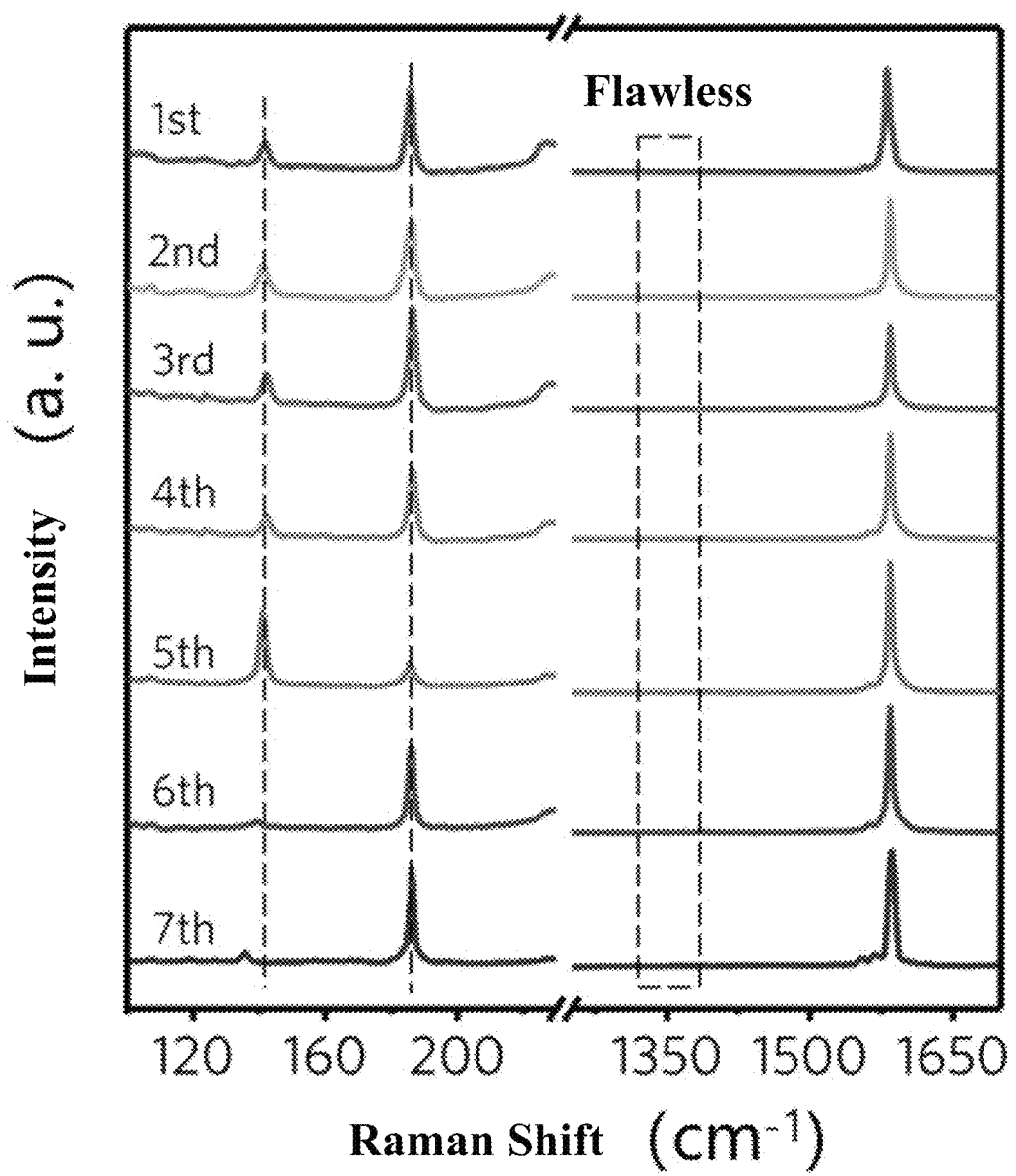
FIG. 7 is a Raman spectrogram collected in different length areas of the single piece of the ultra-long chiral carbon nanotube that is prepared according to one or more embodiments.

FIG. 7 is a Raman spectrogram collected in different length areas of the single-piece of the ultra-long chiral carbon nanotube prepared in Example 1. As shown in FIG. 7, the single piece of the ultra-long chiral carbon nanotube prepared in Example 1 has same peak position and peak number in different length areas, which indicates that the single ultra-long chiral carbon nanotube prepared in Example 1 has stable atomic structure and is a double-walled carbon nanotube.

Experimental Example 4

The growth rates of the ultra-long chiral carbon nanotubes prepared in Examples 1-16 are measured respectively with a low-power scanning electron microscope (25 times). The growth rate is measured by dividing the length of the carbon nanotube by its growth time. During statistics, because the length of the carbon nanotube obtained after growing on each substrate varies, in order to compare the fastest growth rate, only the longest one of every three carbon nanotubes on the same substrate without taking other short carbon nanotubes were counted and taken into consideration. To ensure reliable experimental results, experiments were repeated 3 to 5 times under same conditions and final average lengths were used to calculate the growth rate. The results show that the growth rate of the ultra-long chiral carbon nanotubes prepared in Examples 1-16 is about 70 μm/s-150 μm/s.

Figure 8:
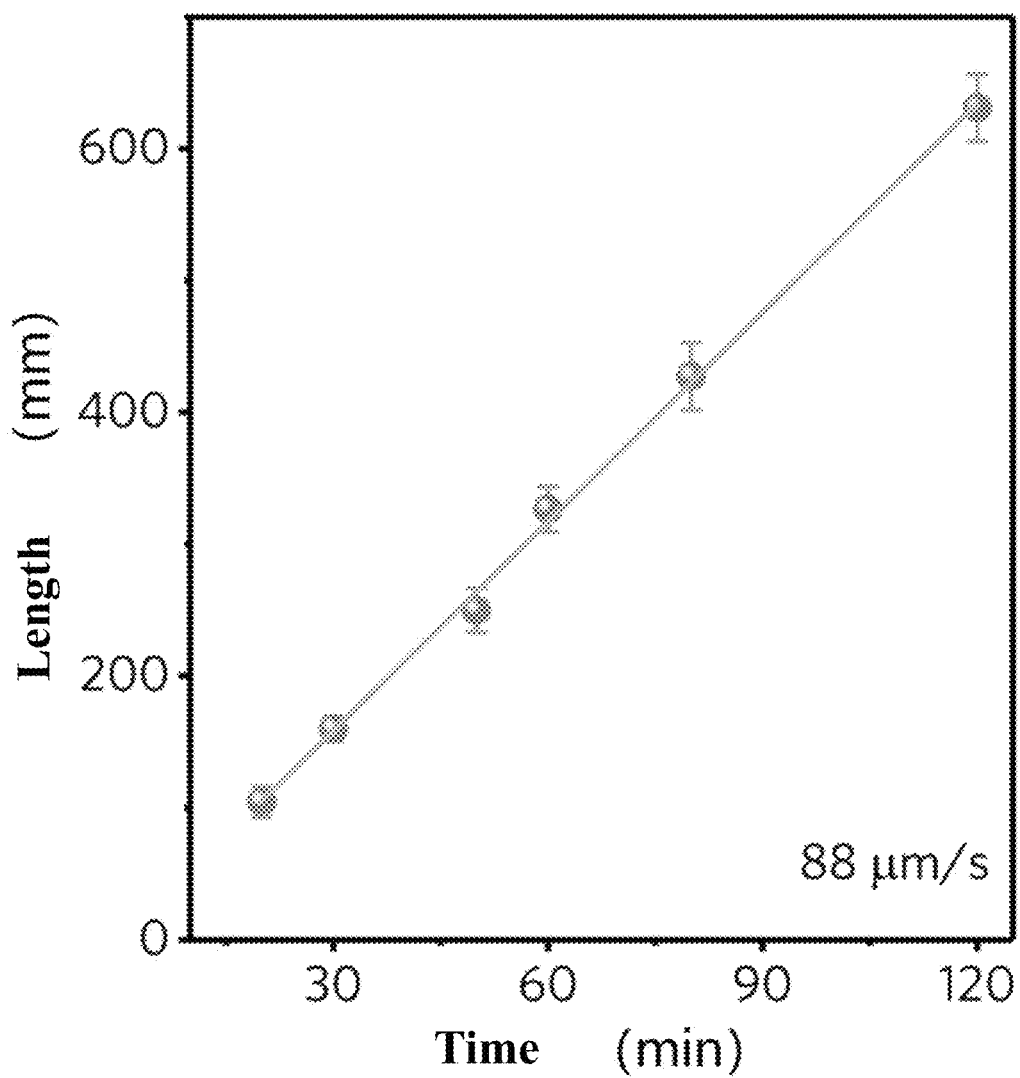
FIG. 8 is a measurement chart of growth rates of the ultra-long chiral carbon nanotube prepared according to one or more embodiments.

FIG. 8 is a measurement chart of the growth rate of the ultra-long chiral carbon nanotube prepared in Example 2. As shown in FIG. 8, calculation is performed according to the average length of the carbon nanotubes at different growth time, the results show that the growth rate of the ultra-long chiral carbon nanotube is 88 μm/s.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. An ultra-long chiral carbon nanotube, comprising:
at least one of a double-walled carbon nanotube and a triple-walled carbon nanotube, wherein each layer of the ultra-long chiral carbon nanotube is semiconducting and has a helix angle greater than 10°, and
wherein the ultra-long chiral carbon nanotube has a diameter between about 1.5 nm and 5.5 nm and has a length between about 100 mm and 650 mm.

2. The ultra-long chiral carbon nanotube of claim 1, wherein the ultra-long chiral carbon nanotube has a minimum band gap distribution of 0.2 eV~0.45 eV.

3. The ultra-long chiral carbon nanotube of claim 1, wherein the ultra-long chiral carbon nanotube has a length between 1.5 nm and 3.5 nm; a difference between two helix angles of respective layers is $\alpha$, wherein $\alpha$ is greater than 0° and less than 15°; the double-walled carbon nanotube has at least one wall with a helix angle $\beta$, wherein $\beta$ is greater than 25° or $\beta$ is between 16° and 22°.

4. The ultra-long chiral carbon nanotube of claim 3, wherein $\beta$ is greater than 25° and equal to or less than 30°, the diameter of the double-walled carbon nanotube is between about 2 nm and 5.5 nm and a length of the double-walled carbon nanotube is between about 154 nm and 650 nm.

5. The ultra-long chiral carbon nanotube of claim 1, wherein the diameter of the triple-walled carbon nanotube is between about 2.5 nm and 5.5 nm;
said triple-walled carbon nanotube has at least one wall with a helix angle $\gamma$, $\gamma$ is either greater than 25° or equal to 19±3°, wherein helix angels of the layers of the triple-walled carbon nanotube are different from each other.

6. The ultra-long chiral carbon nanotube of claim 5, wherein $\gamma$ is greater than 25° and equal to or less than 30°, and a length of the triple-walled carbon nanotube is between 154 nm~650 nm.

7. A method for preparing an ultra-long chiral carbon nanotube, comprising:
loading a catalyst in the form of solid, liquid, or gas into a reactor;
placing a substrate into the reactor;
raising a temperature in the reactor to a reaction temperature under protection of an inert reducing gas;
introducing a gas mixture of carbon source and carrier gas into the reactor for reaction;
introducing the inert reducing gas into the reactor after the reaction completed, to prevent a carbon tube from being ablated during cooling;
cooling the reactor; and
obtaining the ultra-long chiral carbon nanotube once the reactor drops to room temperature, wherein the ultra-long chiral carbon nanotube has a diameter between about 1.5 nm and 5.5 nm and has a length between about 100 mm and 650 mm.

8. The method of claim 7, wherein the catalyst comprises at least one of a transition metal element and a transition metal compound, and the transition metal element is selected from a group consisting of Fe, Co, Ni, Cu, Zn, Cr, Ti, Pd, Pt, and Au; wherein the catalyst is loaded into the reactor through at least one of following manners: spin coating, imprinting, steam plating, and vapor deposition.

9. The method of claim 7, wherein during placing the substrate into the reactor, the reaction temperature is between about 900° C. and 1200° C. and reaction time is between about 6 minutes and 50 minutes.

10. The method of claim 9, wherein
when the reaction time is between about 6 minutes and 15 minutes, a first ultra-long chiral carbon nanotube is obtained, and the first ultra-long chiral carbon nanotube has a length of $L_1$ and a purity of 50-60%, wherein $L_1$ is greater than 50 mm and equal to or less than 100 mm;
when the reaction time is between about 20 minutes and 30 minutes, a second ultra-long chiral carbon nanotube is obtained, and the second ultra-long chiral carbon nanotube has a length of $L_2$ and a purity of 80-90%, wherein $L_2$ is greater than about 100 mm and equal to or less than about 150 mm; and
when the reaction time is between about 35 minutes and 50 minutes, a third ultra-long chiral carbon nanotube is obtained, and the third ultra-long chiral carbon nanotube has a length of $L_3$ and a purity of 100%, wherein $L_3$ is greater than about 150 mm and equal to or less than about 650 mm.

11. The method of claim 7, wherein during placing the substrate into the reactor, when the carbon source is reacting in the reactor, the ultra-long chiral carbon nanotube is grown on the substrate at a growth rate of about 70-150 μm/s.

12. The method of claim 7, wherein during placing the substrate into the reactor, when the carbon source is reacting in the reactor, an external filed is in-situ introduced at any time of the reaction to assist growth of the ultra-long chiral carbon nanotube, wherein the external filed comprises at least one of an electric field, a magnetic field, a sound field, and a light wave.

13. The method of claim 7, wherein during placing the substrate into the reactor, before the temperature is raised to the reaction temperature, the temperature in the reactor is raised with a rate of about 10° C./min to 60° C./min.

14. The method of claim 7, wherein the inert reducing gas is a mixture of inert gas and hydrogen.

15. The method of claim 7, wherein the carrier gas is hydrogen and in the carrier gas, a volume ratio of hydrogen in the carrier gas to carbon source is about 1:1 to 5:1.

16. The method of claim 7, wherein the carrier gas has a water content of about 0.3 wt %~0.6 wt %.

17. The method of claim 7, wherein the carbon source is selected from a group consisting of methane, ethane, propane, methanol, ethanol, ethylene, propylene, and carbon monoxide.

18. The method of claim 7, wherein the inert gas is selected as at least one from a group consisting of helium, neon, and argon.

* * * * *